US011655363B2

United States Patent
Kim et al.

(10) Patent No.: US 11,655,363 B2
(45) Date of Patent: May 23, 2023

(54) TABLETED EPOXY RESIN COMPOSITION FOR ENCAPSULATION OF SEMICONDUCTOR DEVICE AND SEMICONDUCTOR DEVICE ENCAPSULATED USING THE SAME

(71) Applicant: SAMSUNG SDI CO., LTD., Yongin-si (KR)

(72) Inventors: Sang Jin Kim, Suwon-si (KR); Sang Kyun Kim, Suwon-si (KR); Tae Shin Eom, Suwon-si (KR); Dong Hwan Lee, Suwon-si (KR); Young Joon Lee, Suwon-si (KR); Yong Han Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 632 days.

(21) Appl. No.: 16/719,046

(22) Filed: Dec. 18, 2019

(65) Prior Publication Data
US 2020/0199351 A1 Jun. 25, 2020

(30) Foreign Application Priority Data
Dec. 20, 2018 (KR) .......................... 10-2018-0166693

(51) Int. Cl.
| | | |
|---|---|---|
| *C08L 83/00* | (2006.01) | |
| *C08L 63/00* | (2006.01) | |
| *B29B 9/08* | (2006.01) | |
| *B29B 9/12* | (2006.01) | |
| *H01L 23/29* | (2006.01) | |
| *H01L 21/56* | (2006.01) | |
| *C08J 3/22* | (2006.01) | |
| *H01L 25/065* | (2023.01) | |
| *B29K 63/00* | (2006.01) | |
| *B29K 509/02* | (2006.01) | |
| *B29C 43/00* | (2006.01) | |
| *B29K 105/00* | (2006.01) | |
| *H01L 23/495* | (2006.01) | |
| *H01L 23/00* | (2006.01) | |

(52) U.S. Cl.
CPC ............... *C08L 63/00* (2013.01); *B29B 9/08* (2013.01); *B29B 9/12* (2013.01); *C08J 3/226* (2013.01); *H01L 21/565* (2013.01); *H01L 23/295* (2013.01); *B29C 43/003* (2013.01); *B29K 2063/00* (2013.01); *B29K 2105/251* (2013.01); *B29K 2509/02* (2013.01); *B29K 2995/0013* (2013.01); *C08L 2203/206* (2013.01); *C08L 2205/025* (2013.01); *C08L 2310/00* (2013.01); *H01L 23/49541* (2013.01); *H01L 23/49575* (2013.01); *H01L 24/32* (2013.01); *H01L 24/48* (2013.01); *H01L 24/73* (2013.01); *H01L 25/0655* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01)

(58) Field of Classification Search
CPC ............... C08L 63/00; C08L 2203/206; C08L 2205/025; B29B 9/08; B29B 9/12; C08J 3/226; B29K 2063/00; H01L 21/565
See application file for complete search history.

(56) References Cited

U.S. PATENT DOCUMENTS

2012/0001350 A1 1/2012 Wada

FOREIGN PATENT DOCUMENTS

| | | |
|---|---|---|
| CN | 105593296 A | 5/2016 |
| JP | H 09-267329 A | 10/1997 |
| KR | 10-2011-0104507 A | 9/2011 |
| KR | 10-1397221 B1 | 5/2014 |
| KR | 10-2018-0081318 A | 7/2018 |
| TW | 201033279 A | 9/2010 |

OTHER PUBLICATIONS

U.S. Appl. No. 16/722,670 (Year: 2019).*
Taiwanese Office Action dated Mar. 17, 2021 in the corresponding Taiwanese Patent Application No. 108146613.
Korean Office action dated Dec. 8, 2020.
Chinese Office action dated Jun. 24, 2022.

* cited by examiner

*Primary Examiner* — Edward J Cain
(74) *Attorney, Agent, or Firm* — Lee IP Law, P.C.

(57) ABSTRACT

A tableted epoxy resin composition for encapsulation of semiconductor devices and a semiconductor device encapsulated using the tableted epoxy resin composition, the tableted epoxy resin composition satisfying the following conditions (i) a proportion of tablets of the tableted epoxy resin composition having a diameter of greater than or equal to 0.1 mm and less than 2.8 mm and a height of greater than or equal to 0.1 mm and less than 2.8 mm is about 97 wt % or more, as measured by sieve analysis using ASTM standard sieves; (ii) the tablets have a packed density of greater than about 1.7 g/mL; and (iii) a ratio of packed density to cured density of the tablets is about 0.6 to about 0.87.

20 Claims, 3 Drawing Sheets

TABLETED EPOXY RESIN COMPOSITION FOR ENCAPSULATION OF SEMICONDUCTOR DEVICE AND SEMICONDUCTOR DEVICE ENCAPSULATED USING THE SAME

CROSS-REFERENCE TO RELATED APPLICATION

Korean Patent Application No. 10-2018-0166693, filed on Dec. 20, 2018, in the Korean Intellectual Property Office, and entitled: "Tableted Epoxy Resin Composition for Encapsulation of Semiconductor Device and Semiconductor Device Encapsulated Using the Same," is incorporated by reference herein in its entirety.

BACKGROUND

1. Field

Embodiments relate to a tableted epoxy resin composition for encapsulation of semiconductor devices and a semiconductor device encapsulated using the same.

2. Description of the Related Art

As the focus of the electronics market has recently shifted to mobile devices represented by smartphones and tablets, recent research has been focused on developing smaller, lighter, and higher-performance mobile devices. Accordingly, thinner and highly integrated semiconductor devices are under development in order to implement mobile devices that meet the trend of higher-level stacking, higher performance, larger-scale integration, multifunctionality, and slimness.

SUMMARY

The embodiments may be realized by providing a tableted epoxy resin composition for encapsulation of semiconductor devices, the tableted epoxy resin composition satisfying the following conditions (i) a proportion of tablets of the tableted epoxy resin composition having a diameter of greater than or equal to 0.1 mm and less than 2.8 mm and a height of greater than or equal to 0.1 mm and less than 2.8 mm is about 97 wt % or more, as measured by sieve analysis using ASTM standard sieves; (ii) the tablets have a packed density of greater than about 1.7 g/mL; and (iii) a ratio of packed density to cured density of the tablets is about 0.6 to about 0.87.

The tablets may have a cylindrical shape.

The tableted epoxy resin composition may include an inorganic filler, the inorganic filler including silica, alumina, aluminum nitride, calcium carbonate, magnesium carbonate, magnesia, clay, talc, calcium silicate, titanium oxide, antimony oxide, glass fiber, or boron nitride.

The inorganic filler may be present in the tableted epoxy resin composition in an amount of 70 wt % to 99 wt %, based on a total weight of the composition.

The inorganic filler may include silica, and the silica may be present in the inorganic filler in an amount of about 90 wt % or less, based on a total weight of the inorganic filler.

The inorganic filler may include aluminum nitride, and the aluminum nitride may be present in the inorganic filler in an amount of about 50 wt % or less, based on a total weight of the inorganic filler.

The inorganic filler may have an average particle diameter (D50) of about 3 μm to about 15 μm.

The inorganic filler may include alumina, and the alumina may be present in the inorganic filler in an amount of about 10 wt % to about 100 wt %, based on a total weight of the inorganic filler.

The inorganic filler may include alumina, and the alumina may be present in the inorganic filler in an amount of about 75 wt % to about 98 wt %, based on a total weight of the inorganic filler.

The inorganic filler may include a mixture of alumina and silica.

The mixture of alumina and silica may be present in the tableted epoxy resin composition in an amount of about 75 wt % to about 98 wt %, based on a total weight of the composition.

The inorganic filler may include a mixture of silica and aluminum nitride.

The mixture of silica and aluminum nitride may be present in the tableted epoxy resin composition in an amount of about 75 wt % to about 98 wt %, based on a total weight of the composition.

The tablets may have a cured density of about 1.9 g/mL to about 4 g/mL.

The tableted epoxy resin composition may be prepared by compression tableting.

A compressive load applied during the compression tableting may be 0.1 ton to 1 ton.

The embodiments may be realized by providing a tableted epoxy resin composition for encapsulation of semiconductor devices, the composition including an epoxy resin; a curing agent; a curing catalyst; and an inorganic filler, the inorganic filler including silica, alumina, or aluminum nitride, wherein the tableted epoxy resin composition is prepared by compression tableting, the compression tableting including melt kneading an epoxy resin composition that includes the epoxy resin, the curing agent, the curing catalyst, and the inorganic filler followed by cooling and pulverization to provide a powdered composition, feeding the powdered composition into a tablet press, and compressing the powdered composition under a compression load of 0.1 ton to 1 ton to form tablets of the tableted epoxy resin composition.

The composition may satisfy the following conditions (i) a proportion of tablets of the tableted epoxy resin composition having a diameter of greater than or equal to 0.1 mm and less than 2.8 mm and a height of greater than or equal to 0.1 mm and less than 2.8 mm is about 97 wt % or more, as measured by sieve analysis using ASTM standard sieves; (ii) the tablets have a packed density of greater than about 1.7 g/mL; and (iii) a ratio of packed density to cured density of the tablets is about 0.6 to about 0.87.

The embodiments may be realized by providing a semiconductor device encapsulated using the tableted epoxy resin composition for encapsulation of semiconductor devices according to an embodiment.

BRIEF DESCRIPTION OF DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
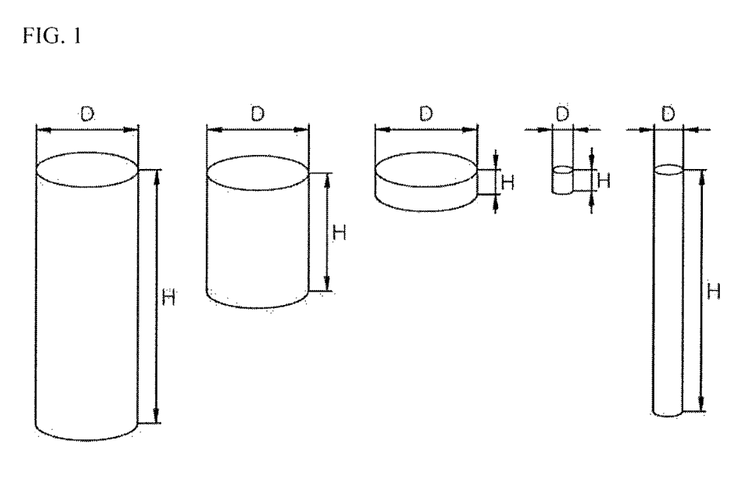
FIG. 1 illustrates a shape, diameter, and height of each exemplary tablet according to an embodiment.

As used herein, the term "tablet" refers to a form having a first surface, a second surface, and a side surface connecting the first surface to the second surface, the first surface being opposite the second surface. In an implementation, the first and second surfaces may each be a planar surface and the side surface may be one curved surface. In an implementation, the tablet may be a cylinder. Referring to FIG. 1, the tablet may be a cylinder, wherein the first surface (or the second surface) of the cylinder may have a predetermined diameter D and the side surface of the cylinder may have a predetermined height H. In an implementation, the "tablet" may also have a shape in which the diameter D is smaller than or equal to the height H, as well as a shape in which the diameter D is greater than the height H.

As used herein, "aspect ratio" may refer to a ratio of height H to diameter D (height H/diameter D).

As used herein, the term "tableted epoxy resin composition for encapsulation of semiconductor devices" may refer to an epoxy resin composition for encapsulation of semiconductor devices, in which the proportion of tablets is 98 wt % or more, e.g., 99 wt % or more. For example, the tableted composition may be in tablet form.

As used herein, "packed density" is a value measured on tablets having a size of greater than or equal to 0.1 mm and less than 2.8 mm, as measured by sieve analysis using ASTM standard sieves. Specifically, some of the tablets having a size of greater than or equal to 0.1 mm and less than 2.8 mm are weighed to obtain a sample, followed by measurement of the weight W of the sample using an electronic scale. Then, a silicone surfactant is introduced into a 50 ml graduated cylinder half filled with water, followed by measurement of the initial volume V1 in the cylinder. Then, the weighed tablets are introduced into the cylinder, followed by measurement of the final volume V2 in the cylinder. Then, packed density (unit: g/mL) of the tablets is calculated according to Equation 1. Here, prior to volume measurement, the cylinder is shaken to remove air between the tablets, and the packed density may be calculated by averaging five measurements:

$$\text{Packed density}(g/mL) = W/(V2-V1) \qquad (1)$$

As used herein, "cured density" may be calculated through a process in which the epoxy resin composition for encapsulation of semiconductor devices is molded into a disk having a size of 50 mm×3 mm (diameter×thickness) in a transfer molding machine under conditions of a mold temperature of 175±5° C., an injection pressure of 7 MPa, and a curing time of 120 seconds, followed by post mold curing (PMC) at 175° C. for 4 hours, and then the mass and volume of the disk are measured, followed by calculation of a ratio of mass to volume (mass/volume, unit:g/mL).

As used herein, "thermal conductivity" is a value measured on a specimen formed of the epoxy resin composition for encapsulation of semiconductor devices at 25° C. in accordance with ASTM D5470.

As used herein to represent a specific numerical range, the expression "X to Y" means "greater than or equal to X and less than or equal to Y".

A tableted epoxy resin composition for encapsulation of semiconductor devices according to one embodiment may satisfy all of the following conditions (i), (ii) and (iii). When satisfying all of (i), (ii) and (iii), the tableted epoxy resin composition may help reduce the possibility of contamination of compression molding equipment (e.g., a vibration feeder and the like) due to scattering of fine particles upon compression molding of a semiconductor device; may help significantly reduce wire sweep upon compression molding; and may have significantly increased thermal conductivity. In an implementation, the tableted epoxy resin composition may have a thermal conductivity of 2 W/mK or more, e.g., 2 W/mK to 10 W/mK, for example, 2 W/mK to 7.5 W/mK. Within this range, a semiconductor device encapsulated using the tableted epoxy resin composition may have high heat dissipation, thereby reducing malfunction and cracking of a semiconductor package due to heat generated during operation of the semiconductor device.

An epoxy resin composition that fails to satisfy one or more of (i), (ii) and (iii), despite including the same type of inorganic fillers in the same amount as in an embodiment may not achieve any or all of the desired effects, e.g., improvement in thermal conductivity, reduction in wire sweep, and reduction in possibility of contamination of compression molding equipment due to scattering of fine particles.

Condition (i) The proportion of tablets having a diameter of greater than or equal to 0.1 mm and less than 2.8 mm and a height of greater than or equal to 0.1 mm and less than 2.8 mm may be, e.g., about 97 wt % or more, as measured by sieve analysis using ASTM standard sieves.

(ii) The tablets may have a packed density of, e.g., greater than about 1.7 g/mL.

(iii) A ratio of packed density to crosslinking density of the tablets may be, e.g., about 0.6 to about 0.87.

In the tableted epoxy resin composition according to an embodiment, the proportion of tablets having a diameter of greater than or equal to 0.1 mm and less than 2.8 mm and a height of greater than or equal to 0.1 mm and less than 2.8 mm may be 97 wt % or more, as measured by sieve analysis using ASTM standard sieves. Maintaining the proportion of tablets having a diameter of less than 0.1 mm or a height of less than 0.1 mm at 3 wt % or less may help ensure that the content of fine particles is not too high, thereby reducing the possibility of the fine particles sticking to the compression molding equipment causing contamination of the equipment. Maintaining the proportion of tablets having a diameter of 2.8 mm or more and a height of 2.8 mm or more at 3 wt % or less may help ensure that the tableted epoxy resin composition is not easily broken during transfer, thereby reducing the possibility of contamination of the compression molding equipment, and also reducing the possibility of an error upon weighing of tablets in the compression molding equipment due to non-uniformity of the tableted epoxy resin composition, and reducing the possibility of a variation in thickness of a semiconductor package and accompanying defects that could otherwise occur due to variation in warpage of the semiconductor package. In an implementation, the proportion of tablets having a diameter of greater than or equal to 0.1 mm and less than 2.8 mm and a height of greater than or equal to 0.1 mm and less than 2.8 mm may be, e.g., about 97 wt % to about 99 wt %, based on the total weight of the tableted epoxy resin composition.

In sieve analysis using ASTM standard sieves, 0.1 mm corresponds to ASTM mesh No. 140 and 2.8 mm corresponds to ASTM mesh No. 7.

The tableted epoxy resin composition according may have a packed density of, e.g., greater than about 1.7 g/mL. Maintaining the packed density at greater than about 1.7 g/mL may help ensure that the tableted epoxy resin composition has sufficient thermal conductivity and that a semiconductor device encapsulated using the tableted epoxy resin has sufficient heat dissipation, thereby reducing the possibility of a malfunction and cracking of a semiconductor package due to heat generated during operation of the semiconductor device. A method of measuring the packed density is as described above. In an implementation, the tableted epoxy resin composition may have a packed density of, e.g., greater than about 1.7 g/mL and less than or equal to about 3.2 g/mL, about 1.71 g/mL to about 3.2 g/mL, or about 1.71 g/mL to about 3 g/mL.

In the tableted epoxy resin composition according, a ratio of packed density to cured density (packed density/cross-linking density) may be, e.g., about 0.6 to about 0.87. Maintaining the ratio at about 0.6 or greater may help ensure that the tableted epoxy resin composition has good meltability and compatibility upon compression molding. Maintaining the ratio at about 0.87 or less may help ensure that the tableted epoxy resin composition exhibits sufficiently increased thermal conductivity and/or may help reduce and/or prevent an increase in wire sweep.

In an implementation, the tableted epoxy resin composition may have a cured density of, e.g., about 1.9 g/mL to about 4 g/mL, about 1.95 g/mL to about 3.5 g/mL, or about 1.95 g/mL to about 3.2 g/mL. Within this range, upon compression molding, the tableted epoxy resin composition may have good meltability and compatibility while reducing occurrence of wire sweep and generation of voids. A method of measuring the cured density is as described above.

In the tableted epoxy resin composition according to an embodiment, the tablets may have an aspect ratio of about 0.1 to about 5, e.g., about 0.25 to about 4. Within this range, the tableted epoxy resin composition may help reduce variation in thickness of a semiconductor package, thereby reducing variation in warpage of the semiconductor package.

In the tableted epoxy resin composition according to an embodiment, the tablets may have a cylindrical shape.

The tableted epoxy resin composition for encapsulation of semiconductor devices according to an embodiment may be prepared by compression tableting described below. Compression tableting may be performed using a tablet press. In an implementation, an epoxy resin composition for encapsulation of semiconductor devices may be melt-kneaded in a continuous kneader at 90° C. to 110° C., followed by cooling and pulverization, thereby preparing a composition in powder form. Then, the prepared preliminary powdery composition may be introduced into a feeder of the tablet press, followed by compressing the powdery composition in a die through downward movement of an upper punch, and then a lower punch may be moved upward, thereby preparing a composition in tablet form. Here, the tableted epoxy resin composition for encapsulation of semiconductor devices may be prepared under adjustment of compression load applied to the powdery composition by downward movement of the upper punch and upward movement of the lower punch, the diameter of the die, the height of the die, and the like.

In an implementation, the compression load may be varied depending on the diameter of the die, the height of the die, the height and width of the powdery composition in the die, and may be, e.g., 0.1 ton to 1 ton. In an implementation, the die may have a diameter of greater than or equal to 0.1 mm and less than 2.8 mm and a height of greater than or equal to 0.1 mm to less than 2.8 mm.

Centrifugal pulverization is a method to prepare an epoxy resin composition for encapsulation of semiconductor devices. In centrifugal pulverization, the centrifugal force of a rotor forces a preliminary composition to pass through a punching mesh having a uniform pore size to be molded into granules. The preliminary composition may be subjected to melt kneading before molding, and melting of the composition obtained by centrifugal pulverization may not be properly achieved upon compression molding, causing defects due to wire sweep and warpage of a semiconductor package due to size differences between granules.

Hot cutting is a method to prepare an epoxy resin composition for encapsulation of semiconductor devices. In hot cutting, a melt-kneaded preliminary epoxy resin composition is subjected to cutting. For example, melting of the composition obtained by hot cutting may not be properly achieved upon compression molding, causing defects due to wire sweep.

Each component of the tableted epoxy resin composition for encapsulation of semiconductor devices according to an embodiment will be described.

In an implementation, the tableted epoxy resin composition may include, e.g., an epoxy resin; a curing agent; a curing catalyst; and inorganic filler.

The epoxy resin may be a mixture of monomers, oligomers, polymers, or the like having at least two epoxy groups per molecule. In an implementation, the epoxy resin may include, e.g., bisphenol epoxy resins, such as a bisphenol A epoxy resin and a bisphenol F epoxy resin, phenol novolac epoxy resins, tert-butylcatechol epoxy resins, naphthalene epoxy resins, glycidyl amine epoxy resins, phenol aralkyl epoxy resins, cresol novolac epoxy resins, biphenyl epoxy resins, linear aliphatic epoxy resins, alicyclic epoxy resins, heterocyclic epoxy resins, spiro ring-containing epoxy resins, cyclohexanedimethanol epoxy resins, halogenated epoxy resins, or biphenyl novolac epoxy resins. These may be used alone or as a mixture thereof.

In an implementation, the curing agent may include a suitable curing agent capable of curing the epoxy resin. In an implementation, the curing agent may include, e.g., polyhydric phenol compounds such as a phenol aralkyl phenol resin, a phenol novolac phenol resin, a biphenyl novolac phenol resin, a Xylok phenol resin, a cresol novolac phenol resin, a naphthol phenol resin, a terpene phenol resin, a polyfunctional phenol resin, a dicyclopentadiene phenol resin, a novolac phenol resin synthesized from bisphenol A and resol, tris(hydroxyphenyl)methane, and dihydroxybiphenyl; acid anhydrides such as maleic anhydride and phthalic anhydride; or aromatic amines such as meta-phenylenediamine, diaminodiphenylmethane, and diaminodiphenylsulfone.

In an implementation, the curing catalyst may include a suitable curing catalyst capable of promoting curing reaction between epoxy groups of the epoxy resin and the curing agent. In an implementation, the curing catalyst may include, e.g., tertiary amines, organometallic compounds, organophosphorus compounds, imidazoles, or boron compounds. In an implementation, the tertiary amines may include, e.g., benzyldimethylamine, triethanolamine, triethylenediamine, diethylaminoethanol, tri(dimethylaminomethyl)phenol, 2-2-(dimethylaminomethyl)phenol, 2,4,6-tris (diaminomethyl)phenol, or tri-2-ethylhexanoate. In an implementation, the organometallic compounds may include, e.g., chromium acetylacetonate, zinc acetylacetonate, or nickel acetylacetonate. In an implementation, the organophosphorus compounds may include, e.g., tris(4-methoxyphenyl)phosphine, triphenylphosphine, triphenylborane, or triphenylphosphine-1,4-benzoquinone adduct. In an implementation, the imidazoles may include, e.g., 2-methylimidazole, 2-phenylimidazole, 2-aminoimidazole, 2-methyl-1-vinylimidazole, 2-ethyl-4-methylimidazole, or 2-heptadecyl imidazole. In an implementation, the boron compounds may include, e.g., triphenylphosphine tetraphenylborate, tetraphenylboron salt, trifluoroborane-n-hexylamine, trifluoroborane monoethylamine, tetrafluoroborane triethylamine, or tetrafluoroborane amine. In an implementation, 1,5-diazabicyclo[4.3.0]non-5-ene (DBN), 1,8-diazabicyclo[5.4.0]undec-7-ene (DBU), or phenol novolac resin salts thereof may be used as the curing catalyst. In an implementation, the adduct obtained by pre-reaction with the epoxy resin or the curing agent may also be used as the curing catalyst.

The inorganic filler may include a suitable inorganic filler for epoxy resin compositions for encapsulation of semiconductor devices.

In an implementation, the inorganic filler may include, e.g., silica, alumina, aluminum nitride, calcium carbonate, magnesium carbonate, magnesia, clay, talc, calcium silicate, titanium oxide, antimony oxide, glass fiber, or boron nitride. In an implementation, the inorganic filler may include alumina to help improve thermal conductivity of the tableted epoxy resin composition. The aforementioned inorganic fillers may be used alone or as a mixture thereof. When a mixture of two or more types of inorganic fillers is used as the inorganic fillers, the two or more types of inorganic fillers may have the same or different average particle diameters (D50). In an implementation, the two or more types of inorganic fillers may have different average particle diameters (D50).

In an implementation, alumina may be used alone as the inorganic filler. In an implementation, the alumina may be present in an amount of, e.g., about 70 wt % to about 99 wt %, or about 75 wt % to about 98 wt %, in the tableted epoxy resin composition. Within this range, the inorganic filler may help improve thermal conductivity of the tableted epoxy resin composition without altering the desired effects of the composition.

In an implementation, a mixture of alumina and silica may be used as the inorganic filler. In an implementation, the mixture of alumina and silica may be present in an amount of, e.g., about 70 wt % to about 99 wt %, or about 75 wt % to about 98 wt %, in the tableted epoxy resin composition. Within this range, the inorganic filler may help improve thermal conductivity of the tableted epoxy resin composition without altering the desired effects of the composition.

In an implementation, a mixture of alumina and aluminum nitride may be used as the inorganic filler. In an implementation, the mixture of alumina and aluminum nitride may be present in an amount of, e.g., about 70 wt % to about 99 wt %, or about 75 wt % to about 98 wt %, in the tableted epoxy resin composition.

In an implementation, a mixture of silica and aluminum nitride may be used as the inorganic filler. In an implementation, the mixture of silica and aluminum nitride may be present in an amount of, e.g., about 70 wt % to about 99 wt %, or about 75 wt % to about 98 wt %, in the tableted epoxy resin composition. Within this range, the inorganic filler may help improve thermal conductivity of the tableted epoxy resin composition without altering the desired effects of the composition.

In an implementation, the amount of alumina in the inorganic filler may be, e.g., about 10 wt % or more, or about 10 wt % to about 100 wt % (based on a total weight of the inorganic filler). Within this range, the inorganic filler may help improve thermal conductivity of the tableted epoxy resin composition without altering the desired effects of the embodiments.

In an implementation, the amount of silica in the inorganic filler may be, e.g., about 90 wt % or less, or from about 10 wt % to about 90 wt %. Within this range, the inorganic filler may help improve thermal conductivity of the tableted epoxy resin composition without altering the desired effects of the embodiments.

In an implementation, the amount of aluminum nitride in the inorganic filler may be, e.g., about 50 wt % or less, about 30 wt % or less, or about 5 wt % to about 30 wt %. Within this range, the inorganic filler may help improve thermal conductivity of the tableted epoxy resin composition without altering the desired effects of the embodiments.

In an implementation, the inorganic filler may have an average particle diameter (D50) of, e.g., about 3 μm to about 15 μm, about 5 μm to about 15 μm, or about 5 μm to about 12 μm. Within this range, the inorganic fillers may help improve fluidity of the epoxy resin composition. Herein, the average particle diameter refers to an average particle diameter represented by D50, and refers to a median value of a weight-based particle size distribution of the inorganic fillers.

The tableted epoxy resin composition may further include a suitable additive. In an implementation, the additive may include, e.g., a coupling agent, a release agent, a stress reliever, a crosslinking enhancer, a leveling agent, or a coloring agent. In an implementation, the coupling agent may include, e.g., epoxysilane, aminosilane, mercaptosilane, alkylsilane, or alkoxysilane. In an implementation, the release agent may include, e.g., paraffin wax, ester wax, a higher fatty acid, a metal salt of a higher fatty acid, a natural fatty acid, or a metal salt of a natural fatty acid. In an implementation, the stress reliever may include, e.g., modified silicone oil, a silicone elastomer, silicone powder, or a silicone resin. In an implementation, the coloring agent may include, e.g., carbon black or the like.

In an implementation, the tableted epoxy resin composition may include, e.g., about 0.5 wt % to about 20 wt %, or about 3 wt % to about 15 wt %, of the epoxy resin, about 0.1 wt % to about 13 wt %, or about 0.1% to about 10 wt %, of the curing agent, about 70 wt % to about 99 wt %, or about 75 wt % to about 98 wt %, of the inorganic filler, about 0.01 wt % to about 2 wt %, or about 0.02 wt % to 1.5 wt %, of the curing catalyst, and about 0.1 wt % to about 10 wt % of the additive.

A semiconductor device according to an embodiment may be encapsulated using the tableted epoxy resin composition for encapsulation of semiconductor devices by compression molding. The semiconductor device may include, e.g., an integrated circuit, a transistor, a thyristor, a diode, a solid-state imaging device, or the like.

Figure 2:
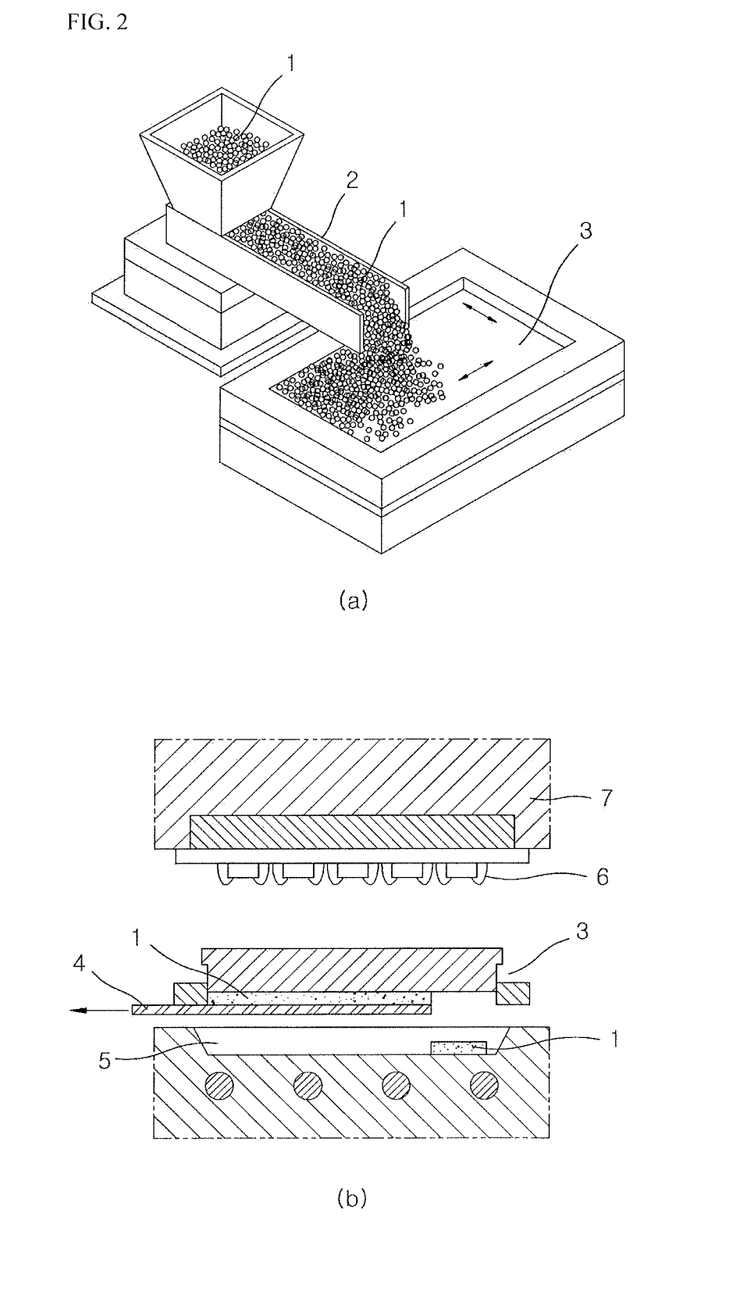
FIG. 2 illustrates an exemplary process of encapsulating a semiconductor device by compression molding according to an embodiment.

Next, a method of encapsulating the semiconductor device using the tabletted epoxy resin composition for encapsulation of semiconductor devices by compression molding will be described with reference to FIG. 2. Referring to part (a) of FIG. 2, the tabletted epoxy resin composition 1 may be introduced into a composition feed container 3 via a vibration feeder 2. For example, the vibration feeder 2 may be vibrated at a constant or variable rate to introduce a predetermined amount of the tabletted epoxy resin composition into the composition feed container 3 at a constant feed rate. Referring to part (b) of FIG. 2, the composition feed container 3 may be provided with a device such as a shutter 4, such that the tabletted epoxy resin composition 1 in the composition supply container 3 may be instantaneously introduced into a lower mold cavity 5 through movement of the shutter 4. An upper substrate 7 with a semiconductor device 6 or the like mounted thereon may be pressed against the lower mold cavity 5. As the tabletted epoxy resin composition 1 is melted and the upper substrate 7 with the semiconductor element 6 and the like mounted thereon is moved downward, the semiconductor device or the like may be gradually dipped into the melt, whereby compression molding is completed.

Figure 3:
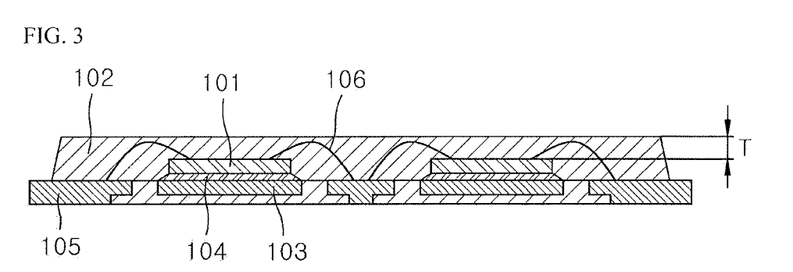
FIG. 3 illustrates an exemplary semiconductor device encapsulated by compression molding according to an embodiment.

FIG. 3 illustrates an exemplary semiconductor device encapsulated by compression molding. Referring to FIG. 3, a semiconductor device 101 may be encapsulated by an encapsulant 102 formed of the tabletted epoxy resin composition. The semiconductor device 101 may be secured to a die pad 103 via a die-bonding material 104. An electrode pad of the semiconductor element 101 may be connected to a lead frame 105 via a wire 106. The semiconductor device may be capsulated by the encapsulant 102 formed of the tabletted epoxy resin composition, a variation in thickness T of a semiconductor package may be small, and a variation in warpage of the semiconductor package may also be small.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

First, 7.01 wt % of a phenol aralkyl epoxy resin (NC-3000, Nippon Kayaku) and 5.73 wt % of a biphenyl epoxy resin (YX-4000, Japan Epoxy Resin) as an epoxy resin; 4.32 wt % of a phenol novolac resin (DL-92, Meiwa Plastic Industries Co., Ltd.) and 1.08 wt % of a phenol aralkyl phenol resin (MEH-7851S, Meiwa Plastic Industries Co., Ltd.) as a curing agent; 0.89 wt % of triphenyl phosphine (Hokko Chemical) as a curing catalyst; 80 wt % (a mixture of 10 wt % of alumina and 70 wt % of silica) of inorganic filler; 0.3 wt % of epoxysilane (KBM-303, Shin Etsu Chemical) and 0.2 wt % of aminosilane (KBM-573, Shin Etsu Chemical) as a coupling agent; 0.37 wt % of carbon black (MA-600B, Mitsubishi Chemical Corporation) as a coloring agent; and 0.1 wt % of carnauba wax as a release agent were mixed using a Henschel mixer (KSM-22, Keum Sung Machinery Co., Ltd), thereby preparing a masterbatch. Here, "wt %" represents the content of each component based on the total weight of the epoxy resin composition for encapsulation of semiconductor devices.

The prepared masterbatch was melt-kneaded in a continuous kneader at 90° C. to 110° C., followed by cooling and pulverization, thereby preparing a composition in powder form. The prepared powdery composition was prepared into a tabletted epoxy resin composition for encapsulation of semiconductor devices using a tablet press.

Specifically, the prepared powdery composition was introduced into a feeder of the tablet press, followed by compressing the powdery composition in a die through downward movement of an upper punch, and then a lower punch was moved upwardly, thereby preparing a composition in tablet form. Here, compression load applied to the powdery composition by downward movement of the upper punch and upward movement of the lower punch was 6 ton, and the diameter and height of the die was adjusted to prepare a tabletted epoxy resin composition for encapsulation of semiconductor devices having physical properties as shown in Table 4.

Examples 2 to 9

An epoxy resin composition for encapsulation of semiconductor devices was prepared in the same manner as in Example 1 except that the content of each component in the epoxy resin composition was changed as listed in Table 1.

The prepared epoxy resin composition was subjected to compression tableting under adjustment of the compression load, the diameter of the die, and/or the height of the die, thereby preparing a tabletted epoxy resin composition for encapsulation of semiconductor devices having physical properties as shown in Table 4.

Comparative Examples 1 to 12

An epoxy resin composition for encapsulation of semiconductor devices was prepared in the same manner as in Example 1 except that the content of each component in the epoxy resin composition was changed as listed in Tables 2 and 3.

The prepared epoxy resin composition was subjected to compression tableting under adjustment of the compression load, the diameter of the die, and/or the height of the die, thereby preparing a tabletted epoxy resin composition for encapsulation of semiconductor devices having physical properties as shown in Tables 5 and 6. Here, the epoxy resin composition of Comparative Example 8 was not moldable into tablets upon compression tableting.

Comparative Example 13

An epoxy resin composition for encapsulation of semiconductor devices was prepared in the same manner as in Example 1 except that the content of each component in the epoxy resin composition was changed as listed in Table 3.

In order to form a cylindrical outer peripheral portion, a punching mesh formed of steel and having a small pore diameter of 2.5 mm was used. Specifically, the punching mesh was machined into a cylinder having a height of 25 mm and a thickness of 1.5 mm, which, in turn, was disposed at the outer periphery of a rotor having a diameter of 20 cm, thereby forming the cylindrical outer peripheral portion. Then, the rotor was rotated at 3,000 rpm such that the cylindrical outer peripheral portion could be heated to 115° C. by an excitation coil. Thereafter, a resin composition having physical properties shown in Table 6 was prepared by a centrifugal pulverization process in which a melt obtained by melt kneading of the master batch in a twin screw extruder while degassing using a degasifier was fed into the rotor at a rate of 2 kg/hr through a double-walled cylindrical body above the rotor, followed by forcing the melt to pass through multiple pores of the cylindrical outer peripheral portion using centrifugal force generated by the rotor. Here, the master batch was kneaded in the twin screw extruder at a temperature of 90° C. to 110° C.

Comparative Examples 14 to 16

An epoxy resin composition for encapsulation of semiconductor devices was prepared in the same manner as in Example 1 except that the content of each component in the epoxy composition was changed as listed in Table 3.

The prepared epoxy resin composition was subjected to centrifugal pulverization in the same manner as in Comparative Example 13. The epoxy resin compositions of Comparative Examples 14 to 16 were not moldable upon centrifugal pulverization.

TABLE 1

| | | Example | | | | | | | | |
|---|---|---|---|---|---|---|---|---|---|---|
| | | 1 | 2 | 3 | 4 | 5 | 6 | 7 | 8 | 9 |
| Epoxy resin | Epoxy resin 1 | 7.01 | 2.22 | 2.22 | 4.44 | 3.33 | 3.69 | 2.95 | 2.22 | 2.22 |
| | Epoxy resin 2 | 5.73 | 1.82 | 1.82 | 3.62 | 2.72 | 3.02 | 2.42 | 1.82 | 1.82 |
| Curing agent | Curing agent 1 | 4.32 | 1.37 | 1.37 | 2.73 | 2.05 | 2.28 | 1.82 | 1.37 | 1.37 |
| | Curing agent 2 | 1.08 | 0.34 | 0.34 | 0.68 | 0.51 | 0.57 | 0.46 | 0.34 | 0.34 |
| Inorganic fillers | Alumina | 10 | 88 | 83 | 37 | 0 | 89 | 91 | 93 | 93 |
| | Silica | 70 | 5 | 10 | 50 | 70 | 0 | 0 | 0 | 0 |
| | Aluminum nitride | 0 | 0 | 0 | 0 | 20 | 0 | 0 | 0 | 0 |
| Curing catalyst | | 0.89 | 0.28 | 0.28 | 0.56 | 0.42 | 0.47 | 0.38 | 0.28 | 0.28 |
| Coupling agent | Coupling agent 1 | 0.3 | 0.3 | 0.3 | 0.3 | 0.3 | 0.3 | 0.3 | 0.3 | 0.3 |
| | Coupling agent 2 | 0.2 | 0.2 | 0.2 | 0.2 | 0.2 | 0.2 | 0.2 | 0.2 | 0.2 |
| Coloring agent | | 0.37 | 0.37 | 0.37 | 0.37 | 0.37 | 0.37 | 0.37 | 0.37 | 0.37 |
| Release agent | | 0.1 | 0.1 | 0.1 | 0.1 | 0.1 | 0.1 | 0.1 | 0.1 | 0.1 |
| Total | | 100 | 100 | 100 | 100 | 100 | 100 | 100 | 100 | 100 |

TABLE 2

| | | Comparative Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Epoxy resin | Epoxy resin 1 | 10.69 | 10.69 | 7.01 | 4.44 | 3.33 | 4.44 | 4.44 | 4.44 | 4.44 | 4.44 | 4.44 |
| | Epoxy resin 2 | 8.74 | 8.74 | 5.73 | 3.62 | 2.72 | 3.62 | 3.62 | 3.62 | 3.62 | 3.62 | 3.62 |
| Curing agent | Curing agent 1 | 6.59 | 6.59 | 4.32 | 2.73 | 2.05 | 2.73 | 2.73 | 2.73 | 2.73 | 2.73 | 2.73 |
| | Curing agent 2 | 1.65 | 1.65 | 1.08 | 0.68 | 0.51 | 0.68 | 0.68 | 0.68 | 0.68 | 0.68 | 0.68 |
| Inorganic fillers | Alumina | 0 | 0 | 0 | 0 | 0 | 0 | 0 | 0 | 0 | 0 | 37 |
| | Silica | 70 | 70 | 80 | 87 | 90 | 87 | 87 | 87 | 87 | 87 | 40 |
| | Aluminum nitride | 0 | 0 | 0 | 0 | 0 | 0 | 0 | 0 | 0 | 0 | 10 |
| Curing catalyst | | 1.36 | 1.36 | 0.89 | 0.56 | 0.42 | 0.56 | 0.56 | 0.56 | 0.56 | 0.56 | 0.56 |
| Coupling agent | Coupling agent 1 | 0.3 | 0.3 | 0.3 | 0.3 | 0.3 | 0.3 | 0.3 | 0.3 | 0.3 | 0.3 | 0.3 |
| | Coupling agent 2 | 0.2 | 0.2 | 0.2 | 0.2 | 0.2 | 0.2 | 0.2 | 0.2 | 0.2 | 0.2 | 0.2 |
| Coloring agent | | 0.37 | 0.37 | 0.37 | 0.37 | 0.37 | 0.37 | 0.37 | 0.37 | 0.37 | 0.37 | 0.37 |
| Release agent | | 0.1 | 0.1 | 0.1 | 0.1 | 0.1 | 0.1 | 0.1 | 0.1 | 0.1 | 0.1 | 0.1 |
| Total | | 100 | 100 | 100 | 100 | 100 | 100 | 100 | 100 | 100 | 100 | 100 |

TABLE 3

| | | Comparative Example | | | | |
|---|---|---|---|---|---|---|
| | | 12 | 13 | 14 | 15 | 16 |
| Epoxy resin | Epoxy resin 1 | 2.22 | 3.33 | 10.69 | 2.22 | 2.22 |
| | Epoxy resin 2 | 1.82 | 2.72 | 8.74 | 1.82 | 1.82 |
| Curing agent | Curing agent 1 | 1.37 | 2.05 | 6.59 | 1.37 | 1.37 |
| | Curing agent 2 | 0.34 | 0.51 | 1.65 | 0.34 | 0.34 |
| Inorganic fillers | Alumina | 93 | 0 | 0 | 0 | 93 |
| | Silica | 0 | 90 | 70 | 93 | 0 |
| | Aluminum nitride | 0 | 0 | 0 | 0 | 0 |
| Curing catalyst | | 0.28 | 0.42 | 1.36 | 0.28 | 0.28 |
| Coupling agent | Coupling agent 1 | 0.3 | 0.3 | 0.3 | 0.3 | 0.3 |
| | Coupling agent 2 | 0.2 | 0.2 | 0.2 | 0.2 | 0.2 |

TABLE 3-continued

|  | Comparative Example | | | | |
|---|---|---|---|---|---|
|  | 12 | 13 | 14 | 15 | 16 |
| Coloring agent | 0.37 | 0.37 | 0.37 | 0.37 | 0.37 |
| Release agent | 0.1 | 0.1 | 0.1 | 0.1 | 0.1 |
| Total | 100 | 100 | 100 | 100 | 100 |

In Tables 1 to 3, epoxy resin 1 is a phenol aralkyl epoxy resin, epoxy resin 2 is a biphenyl epoxy resin, curing agent 1 is a phenol novolac resin, curing agent 2 is a phenol aralkyl phenolic resin, curing catalyst is triphenyl phosphine, the alumina has an average particle diameter (D50) of 9 μm, the silica has an average particle diameter (D50) of 8 μm, the aluminum nitride has an average particle diameter (D50) of 3 μm, coupling agent 1 is epoxysilane, and coupling agent 2 is aminosilane.

Each of the tableted epoxy resin compositions for encapsulation of semiconductor devices prepared in Examples and Comparative Examples was evaluated as to the following physical properties. Results are shown in Tables 4, 5, and 6.

(1) Tablet size of tableted epoxy resin composition for sealing semiconductor devices: Using ASTM standard mesh sieves, each of the tableted epoxy resin compositions prepared in the Examples and Comparative Examples was sieved with a 0.1 mm mesh (ASTM No. 140) and a 2.8 mm mesh (ASTM No. 7) for 10 minutes while shaking the tableted resin composition at a rate of 100 strokes per minute using a sieve vibrator, followed by measurement of the weight of tablets that passed through the 2.8 mm mesh and were retained on the 0.1 mm mesh and the weight of tablets that were retained on the 2.8 mm mesh or passed through the 0.1 mm mesh, thereby determining the proportion (%) of tablets having a size of greater than or equal to 0.1 mm and less than 2.8 mm.

(2) Packed density: Packed density was measured on tablets that passed through a 2.8 mm mesh and were retained on a 0.1 mm mesh upon sieving using ASTM standard mesh sieves. Specifically, some of the tablets were weighed to obtain a sample, followed by measurement of the weight W of the sample using an electronic scale. Then, a silicone surfactant was introduced into a 50 ml graduated cylinder half filled with water, followed by measurement of the initial volume V1 in the cylinder. Then, the weighed tablets were introduced into the cylinder, followed by measurement of the final volume V2 in the cylinder. Then, packed density (g/mL) of the tablets was calculated according to Equation 1, below. Here, prior to volume measurement, the cylinder was shaken to remove air between the tablets, and the packed density was calculated by averaging five measurements:

$$\text{Packed density}(g/mL) = W/(V2-V1) \quad (1)$$

(3) Cured density: Each of the tableted epoxy resin compositions prepared in the Examples and Comparative Examples was molded into a disk having a size of 50 mm×3 mm (diameter×thickness) in a transfer molding machine under conditions of a mold temperature of 175±5° C., an injection pressure of 7 MPa, and a curing time of 120 seconds, followed by post mold curing (PMC) in an oven at 175° C. for 4 hours, and then the mass and volume of the disk was measured, followed by calculation of a ratio of mass to volume (mass/volume, unit:g/mL).

(4) Thermal conductivity: Each of the tableted epoxy resin compositions prepared in the Examples and Comparative Examples was injected into a transfer molding machine under conditions of a mold temperature of 175° C., an injection pressure of 9 MPa, and a curing time of 120 seconds to prepare a specimen for evaluation of thermal conductivity, followed by measurement of thermal conductivity of the specimen using a thermal conductivity tester (QTM-500, Kyoto Electronics) at 25° C. in accordance with ASTM D5470.

(5) Degree of contamination of equipment due to scattering of fine particles upon compression molding: Compression molding equipment (PMC-1040, TOWA Corporation) was used in compression molding. First, 25 g of each of the tableted epoxy resin compositions prepared in the Examples and Comparative Examples was placed in a vibration feeder, and operation of feeding the tableted epoxy resin composition at a constant rate of 1.0 g/sec was repeated 20 times. After completion of the feeding operations, the vibration feeder was removed, followed by measurement of the weight of the tableted epoxy resin composition stuck to a wall of the vibration feeder. When the total weight of the tableted epoxy resin composition stuck to the wall of the vibration feeder was less than 150 mg and sticking of the tableted epoxy resin composition to an inner tube of the vibration feeder was not observed with the naked eye, a corresponding specimen was rated as ×, when the total weight of the tableted epoxy resin composition stuck to the wall of the vibration feeder was less than 150 mg and sticking of the tableted epoxy resin composition to the inner tube of the vibration feeder was observed with the naked eye, a corresponding specimen was rated as Δ, and, when the total weight of the tableted epoxy resin composition stuck to the wall of the vibration feeder was greater than or equal to 50 mg and blackening of the inner tube of the vibration feeder, indicative of severe sticking of the tableted epoxy resin composition to the inner tube, was observed with the naked eye, a corresponding specimen was rated as o.

(6) Wire sweep: First, chips (die size: 10 mm×10 mm×0.5 mm (length×width×thickness) were mounted on a printed wiring board (substrate size: 240 mm×77.5 mm (length× width), unit size: 14 mm×18 mm (width×length). Each of the chips was connected to the printed wiring board using a gold wire having a diameter of 0.8 mm. Compression molding equipment (PMC-1040, TOWA Corporation) was used. A predetermined amount of each of the tableted epoxy resin compositions prepared in the Examples and Comparative Examples was introduced into the compression molding equipment, followed by molding of a semiconductor package under conditions of a mold temperature of 175° C., a curing time of 100 seconds, and a molding pressure of 10 ton, and a molding thickness of 0.7 mm. Then, wire sweep evaluation was conducted on 10 wires (length: 3 mm) of the semiconductor package using an X-ray inspection apparatus (Tosmicron-S4090, Toshiba).

TABLE 4

| | | Example | | | | | | | | |
|---|---|---|---|---|---|---|---|---|---|---|
| | Item | 1 | 2 | 3 | 4 | 5 | 6 | 7 | 8 | 9 |
| Preparative conditions | Preparation method | Compression tableting | | | | | | | | |
| | Compression load (ton) | 0.6 | 0.6 | 0.6 | 0.6 | 0.6 | 0.6 | 0.6 | 0.6 | 0.2 |
| | Average diameter (D, mm) | 1.5 | 1.5 | 1.5 | 1.5 | 1.5 | 1.5 | 1.5 | 1.5 | 1.5 |
| | Average height (H, mm) | 0.43 | 0.52 | 0.52 | 0.48 | 0.54 | 0.57 | 0.59 | 0.59 | 0.63 |
| Tablet size | Content of tablets with size of greater than or equal to 0.1 mm and less than 2.8 mm (%) | 97.2 | 97.2 | 97.2 | 97.5 | 98.1 | 97.2 | 97.2 | 97.3 | 97.1 |
| Composition | Inorganic fillers | Alumina + silica | | | | Silica + aluminum nitride | Alumina | | | |
| | Content of inorganic fillers (wt %) | 80 | 93 | 93 | 87 | 90 | 89 | 91 | 93 | 93 |
| Packed density (g/mL) | | 1.71 | 2.57 | 2.39 | 1.83 | 2.06 | 2.29 | 2.29 | 2.72 | 2.51 |
| Cured density (g/mL) | | 1.96 | 3.03 | 2.99 | 2.21 | 2.49 | 2.9 | 2.9 | 3.16 | 3.16 |
| Density ratio (Packed density/Cured density) | | 0.87 | 0.85 | 0.80 | 0.83 | 0.83 | 0.79 | 0.79 | 0.86 | 0.79 |
| Shape | | Cylinder | | | | | | | | |
| Thermal conductivity (W/mK) | | 2 | 2.7 | 2.7 | 2.3 | 7.2 | 4.1 | 4.3 | 4.9 | 4.9 |
| Degree of contamination of equipment due to fine particles upon compression molding | | x | x | x | x | x | x | x | x | x |
| Wire sweep (%) | | 2.4 | 9.2 | 9.7 | 6.2 | 8.1 | 4.7 | 6.4 | 9.4 | 8.1 |

TABLE 5

| | | Comparative Example | | | | | | | | |
|---|---|---|---|---|---|---|---|---|---|---|
| | Item | 1 | 2 | 3 | 4 | 5 | 6 | 7 | 8 | 9 |
| Prep. conditions | Prep. method | Compression tableting | | | | | | | | |
| | Compression load (ton) | 0.1 | 0.3 | 0.2 | 0.2 | 0.4 | 2 | 1.3 | 0.05 | 0.2 |
| Tablet size | Average diameter (mm) | 1.5 | 1.5 | 1.5 | 1.5 | 1.5 | 1.5 | 1.5 | Not moldable | 1.5 |
| | Average height (mm) | 1.3 | 0.9 | 1.1 | 1.1 | 0.7 | 0.3 | 0.44 | | 1.1 |
| | Content of tablets with size of greater than or equal to 0.1 mm and less than 2.8 mm (%) | 95.4 | 98.3 | 98.3 | 97.2 | 97.3 | 98.3 | 97.8 | | 93 |
| Composition | Inorganic filler | Silica | | | | | | | | |
| | Content of inorganic filler (wt %) | 70 | 70 | 80 | 87 | 90 | 87 | 87 | 87 | 87 |
| Packed density (g/mL) | | 1.06 | 1.21 | 1.32 | 1.41 | 1.61 | 1.83 | 1.75 | Not moldable | 1.41 |
| Cured density (g/mL) | | 1.78 | 1.78 | 1.89 | 1.96 | 2 | 1.97 | 1.97 | | 1.97 |
| Density ratio (Packed density/Cured density) | | 0.59 | 0.68 | 0.70 | 0.72 | 0.81 | 0.93 | 0.89 | | 0.72 |
| Shape | | Cylinder | | | | | | | Cylinder | |
| Thermal conductivity (W/mK) | | 0.62 | 0.62 | 0.77 | 0.85 | 1.1 | 0.7 | 0.7 | | 0.7 |
| Degree of contamination of equipment due to fine particles upon compression molding | | x | x | x | x | x | x | x | | ○ |
| Wire sweep (%) | | 0 | 0 | 1.4 | 1.9 | 3.2 | 22.4 | 16.7 | | 2.2 |

TABLE 6

| | | Comparative Example | | | | | | |
|---|---|---|---|---|---|---|---|---|
| Item | | 10 | 11 | 12 | 13 | 14 | 15 | 16 |
| Prep. conditions | Prep. method | Compression tableting | | | Centrifugal pulverization | | | |
| | Compression load (ton) | 0.2 | 1.5 | 1.5 | — | Not moldable | | |
| Tablet size | Average diameter (mm) | 1.5 | 1.5 | 1.5 | — | | | |
| | Average height (mm) | 1.1 | 0.63 | 0.63 | — | | | |
| | Content of tablets with size of greater than or equal to 0.1 mm and less than 2.8 mm (%) | 96 | 97.3 | 97.3 | — | | | |
| Composition | Inorganic filler | Silica | Alumina + silica + aluminum nitride | Alumina | Silica | Silica | Silica | Alumina |
| | Content of inorganic filler (%) | 87 | 87 | 93 | 90 | 70 | 93 | 93 |
| Packed density (g/mL) | | 1.41 | 1.6 | 2.84 | 1.81 | Not moldable | | |
| Cured density (g/mL) | | 1.97 | 1.92 | 3.16 | 2 | | | |
| Density ratio (Packed density/Cured density) | | 0.72 | 0.83 | 0.90 | 0.91 | | | |
| Shape | | Cylinder | | | Granule | | | |
| Thermal conductivity (W/mK) | | 0.7 | 2.2 | 4.9 | 1 | | | |
| Degree of contamination of equipment due to fine particles upon compression molding | | Δ | x | x | x | | | |
| Wire sweep (%) | | 2 | 19.4 | 20.3 | 0 | | | |

As shown in Table 4, the tableted epoxy resin compositions according to the Examples could be prevented from scattering and/or sticking to compression molding equipment upon encapsulation of a semiconductor device by compression molding, thereby reducing contamination of the equipment. In addition, the tableted epoxy resin compositions according to the Examples had a thermal conductivity of 2 W/mK or more and thus allowed a semiconductor device encapsulated using the same to have high heat dissipation, thereby reducing malfunction and cracking of a semiconductor package due to heat generated during operation of the semiconductor device.

On the contrary, as shown in Tables 5 and 6, the epoxy resin compositions of Comparative Examples 1 to 12, which failed to satisfy all of the requirements set forth herein ((i), (ii), and (iii)) despite being prepared by compression tableting, exhibited poor properties in terms of reduction in wire sweep, increase in thermal conductivity, and prevention of contamination of compression molding equipment due to dust particles.

By way of summation and review, when a highly stacked and highly integrated semiconductor device is encapsulated in a small and thin semiconductor package, malfunction and cracking of the package could occur more frequently due to heat generated during operation of the semiconductor device. A heat sink may be used, but such a heat sink may be available only to some semiconductor packages and may require additional processes, causing low productivity and high cost. An epoxy resin composition for encapsulation of semiconductor devices according to an embodiment may have high thermal conductivity.

A method of encapsulating a semiconductor device through compression molding has been considered. Compression molding is a technique of molding articles in a mold and has recently attracted attention due to ability to suppress generation of voids even upon encapsulation of a multi-stacked semiconductor device. Upon compression molding, an epoxy resin composition for encapsulation of semiconductor devices may be introduced into a mold in film or sheet form. In view of moldability, flowabilty, and the like of the epoxy resin composition, the composition may be introduced in powder or granule form. There may be a certain degree of difference in size between powder particles or granules, causing wire sweep and/or warpage of a semiconductor package.

A centrifugal pulverization technique and a hot-cut technique may be used to prepare epoxy resin compositions for encapsulation of semiconductor devices. These methods may not be suitable for preparing an epoxy resin composition requiring high thermal conductivity for encapsulation of a semiconductor device through compression molding.

One or more embodiments may provide a tableted epoxy resin composition for encapsulation of semiconductor devices, which has high thermal conductivity.

One or more embodiments may provide a tableted epoxy resin composition for encapsulation of semiconductor devices, which can be prevented from scattering and/or sticking to compression molding equipment upon encapsulation of a semiconductor device by compression molding, thereby reducing contamination of the compression molding equipment.

One or more embodiments may provide a tableted epoxy resin composition for encapsulation of semiconductor devices, which may help significantly reduce wire sweep upon encapsulation of a semiconductor device by compression molding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A tableted epoxy resin composition for encapsulation of semiconductor devices, the tableted epoxy resin composition satisfying the following conditions:
   (i) a proportion of tablets of the tableted epoxy resin composition having a diameter of greater than or equal to 0.1 mm and less than 2.8 mm and a height of greater than or equal to 0.1 mm and less than 2.8 mm is about 97 wt % or more, as measured by sieve analysis using ASTM standard sieves;
   (ii) the tablets have a packed density of greater than 1.7 g/mL; and
   (iii) a ratio of packed density to cured density of the tablets is about 0.6 to about 0.87.

2. The tableted epoxy resin composition as claimed in claim 1, wherein the tablets have a cylindrical shape.

3. The tableted epoxy resin composition as claimed in claim 1, wherein the tableted epoxy resin composition includes an inorganic filler, the inorganic filler including silica, alumina, aluminum nitride, calcium carbonate, magnesium carbonate, magnesia, clay, talc, calcium silicate, titanium oxide, antimony oxide, glass fiber, or boron nitride.

4. The tableted epoxy resin composition as claimed in claim 3, wherein the inorganic filler is present in the tableted epoxy resin composition in an amount of 70 wt % to 99 wt %, based on a total weight of the composition.

5. The tableted epoxy resin composition as claimed in claim 3, wherein:
   the inorganic filler includes silica, and
   the silica is present in the inorganic filler in an amount of about 90 wt % or less, based on a total weight of the inorganic filler.

6. The tableted epoxy resin composition as claimed in claim 3, wherein:
   the inorganic filler includes aluminum nitride, and
   the aluminum nitride is present in the inorganic filler in an amount of about 50 wt % or less, based on a total weight of the inorganic filler.

7. The tableted epoxy resin composition as claimed in claim 3, wherein the inorganic filler has an average particle diameter (D50) of about 3 μm to about 15 μm.

8. The tableted epoxy resin composition as claimed in claim 3, wherein:
   the inorganic filler includes alumina, and
   the alumina is present in the inorganic filler in an amount of about 10 wt % to about 100 wt %, based on a total weight of the inorganic filler.

9. The tableted epoxy resin composition as claimed in claim 3, wherein:
   the inorganic filler includes alumina, and
   the alumina is present in the inorganic filler in an amount of about 75 wt % to about 98 wt %, based on a total weight of the inorganic filler.

10. The tableted epoxy resin composition as claimed in claim 3, wherein the inorganic filler includes a mixture of alumina and silica.

11. The tableted epoxy resin composition as claimed in claim 10, wherein the mixture of alumina and silica is present in the tableted epoxy resin composition in an amount of about 75 wt % to about 98 wt %, based on a total weight of the composition.

12. The tableted epoxy resin composition as claimed in claim 3, wherein the inorganic filler includes a mixture of silica and aluminum nitride.

13. The tableted epoxy resin composition as claimed in claim 12, wherein the mixture of silica and aluminum nitride is present in the tableted epoxy resin composition in an amount of about 75 wt % to about 98 wt %, based on a total weight of the composition.

14. The tableted epoxy resin composition as claimed in claim 1, wherein the tablets have a cured density of about 1.9 g/mL to about 4 g/mL.

15. The tableted epoxy resin composition as claimed in claim 1, wherein the tableted epoxy resin composition is prepared by compression tableting.

16. The tableted epoxy resin composition as claimed in claim 15, wherein a compressive load applied during the compression tableting is 0.1 ton to 1 ton.

17. A tableted epoxy resin composition for encapsulation of semiconductor devices, the composition comprising:
   an epoxy resin;
   a curing agent;
   a curing catalyst; and
   an inorganic filler, the inorganic filler including silica, alumina, or aluminum nitride,
   wherein the tableted epoxy resin composition is prepared by compression tableting, the compression tableting including:
   melt kneading an epoxy resin composition that includes the epoxy resin, the curing agent, the curing catalyst, and the inorganic filler followed by cooling and pulverization to provide a powdered composition,
   feeding the powdered composition into a tablet press, and
   compressing the powdered composition under a compression load of 0.1 ton to 1 ton to form tablets of the tableted epoxy resin composition.

18. The tableted epoxy resin composition as claimed in claim 17, wherein the composition satisfies the following conditions:
   (i) a proportion of tablets of the tableted epoxy resin composition having a diameter of greater than or equal to 0.1 mm and less than 2.8 mm and a height of greater than or equal to 0.1 mm and less than 2.8 mm is about 97 wt % or more, as measured by sieve analysis using ASTM standard sieves;
   (ii) the tablets have a packed density of greater than about 1.7 g/mL; and
   (iii) a ratio of packed density to cured density of the tablets is about 0.6 to about 0.87.

19. A semiconductor device encapsulated using the tableted epoxy resin composition for encapsulation of semiconductor devices as claimed in claim 1.

20. A semiconductor device encapsulated using the tableted epoxy resin composition for encapsulation of semiconductor devices as claimed in claim 17.

* * * * *